United States Patent [19]
Ang

[11] Patent Number: 5,642,325
[45] Date of Patent: Jun. 24, 1997

[54] REGISTER FILE READ/WRITE CELL

[75] Inventor: Michael Anthony Ang, Santa Clara, Calif.

[73] Assignee: Philips Electronics North America Corporation, New York, N.Y.

[21] Appl. No.: 534,682

[22] Filed: Sep. 27, 1995

[51] Int. Cl.$^6$ ............................................. G11C 7/00
[52] U.S. Cl. ............................ 365/230.05; 365/154
[58] Field of Search ................................. 365/154, 156, 365/230.05, 189.05, 189.04

[56] References Cited

U.S. PATENT DOCUMENTS

| | | |
|---|---|---|
| 4,380,055 | 4/1983 | Larson ........................ 365/154 |
| 5,023,844 | 6/1991 | Arnold et al. .............. 365/230.05 |
| 5,065,363 | 11/1991 | Sato et al. ..................... 365/154 |
| 5,189,640 | 2/1993 | Huard . | 
| 5,307,322 | 4/1994 | Usami et al. ................. 365/154 |
| 5,355,335 | 10/1994 | Katsuno et al. ............ 365/189.05 |

*Primary Examiner*—David C. Nelms
*Assistant Examiner*—Vu A. Le
*Attorney, Agent, or Firm*—Debra K. Stephens

[57] ABSTRACT

A cell in a multiport memory is connected to a respective bit line via respective switches. A write enable element is located between the switches and an input of the cell's storage device. A read enable element is located between an output of the storage device and the same switches. Thus, read bit lines and write bit lines are merged and the number of switches per cell is drastically reduced with respect to prior art multiport memories.

5 Claims, 2 Drawing Sheets

5,642,325

REGISTER FILE READ/WRITE CELL

FIELD OF THE INVENTION

The invention relates to an electronic circuit comprising a multiport memory.

BACKGROUND ART

Multiport memories are well known devices that have multiple ports to enable parallel accesses to the memory, e.g., for simultaneous reading of a first memory location via a first port and writing of a second memory location via a second port. Typically, multiport memories find application particularly within data processing devices as register files or as caches. A register file is a temporary buffer for intermediate results and arguments produced and used by the functional parts of the data processing device. A cache is a high-speed storage coupled to a much slower and larger main storage for enabling fast access to part of the contents of the main storage loaded in advance into the cache. The cache being a high-speed memory takes advantage of the locality of references within computer programs to store data which is likely to be reused in the high-speed memory.

U.S. Pat. No. 5,189,640 issued to Huard discloses a cell of a multiport memory. The known cell includes a bistable element made up of cross-coupled inverters. The bistable element is connected to multiple pairs of read bit lines via multiple pairs of read switches, and to multiple pairs of write bit lines via multiple pairs of write switches. The read and write switches are controlled via read-enable lines and multiple write-enable lines.

OBJECT OF THE INVENTION

The multiple read switches, the multiple write switches, the multiple read bit lines, multiple write bit lines, and multiple enable lines render the known configuration highly demanding of semiconductor substrate area.

It is, inter alia, an object of the invention to provide an electronic circuit that has a multiport memory of certain storage capacity that requires significantly less substrate area than a prior art device of the same storage capacity.

SUMMARY OF THE INVENTION

To this end, the invention provides an electronic circuit with a multi-port memory that includes a plurality of memory cells. Each cell is coupled to multiple, independently controllable bit lines. Each cell comprises a storage device for storage of a single bit, and multiple switches. Each respective one of the switches is operative to selectively connect the storage device to a respective one of the bit lines. Each storage device comprises a write enable element coupled between the multiple switches and an input of the storage device for enabling writing of the cell, and a read enable element coupled between an output of the storage device and the multiple switches for enabling reading of the cell.

With regard to the prior art, the multiple read switches and the multiple write switches are replaced by the combination of multiple switches, together with a read enable element and a write enable element. Moreover, the read bit lines and the write bit lines are merged. In other words, the switches in the invention serve to connect one or more selected ones of the multiple bit lines to the storage device, while the read enable element enables transfer of the bit stored to one or more selected bit lines or the write enable element enables transfer of a bit on a selected bit line to the storage device.

It is clear that the memory configuration according to the invention requires considerably less substrate area and considerably fewer components than the known memory.

BRIEF DESCRIPTION OF THE DRAWING

The invention is explained below in further detail and by way of example with reference to the accompanying drawing, wherein.

Throughout the drawing like reference symbols indicate corresponding or similar features.

DETAILED EMBODIMENTS

Figure 1:
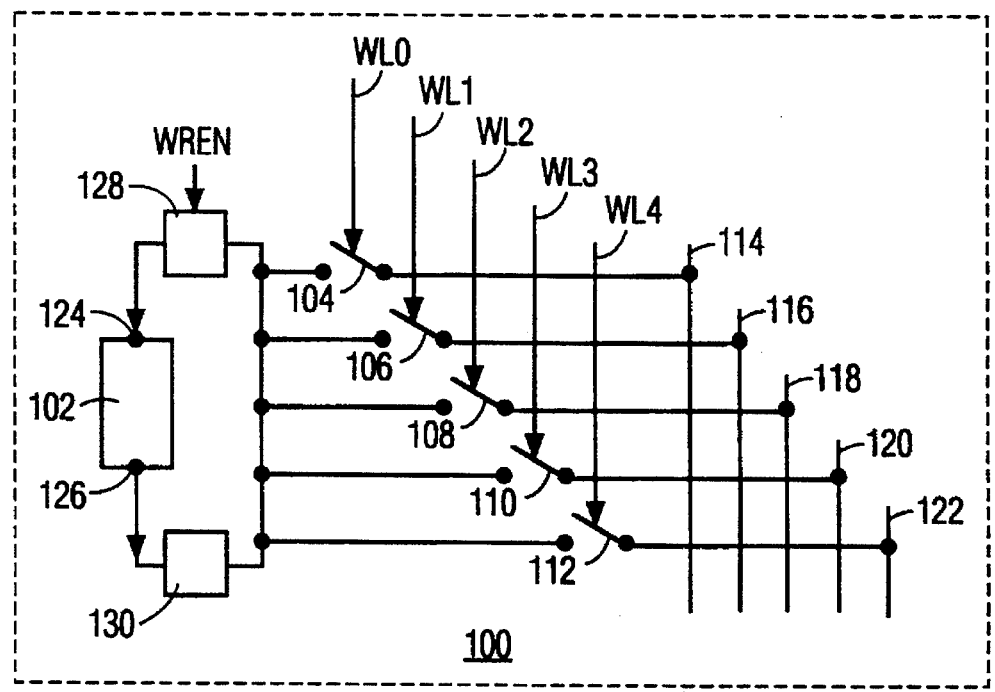
FIG. 1 is a block diagram of the memory cell according to the invention.

FIG. 1 is a block diagram of a memory cell 100 in the invention. Cell 100 comprises a storage element 102 for the storage of a bit of information, and switches 104, 106, 108, 110 and 112 for selective coupling of element 102 to one or more of bit lines 114, 116, 118, 120 and 122. Switches 104–112 are controlled by respective ones of selection signals WL0, WL1, WL2, WL3 and WL4. Element 102 has an input 124 for writing data into element 102, and an output 126 for reading data stored in element 102. Cell 100 further comprises a write enable element 128 that connects all of switches 104–112 to input 124, and a read enable element 130 that connects output 126 to all of switches 104–112. In this example, write enable element 128 is controlled through a write-enable signal WREN, and read enable element is automatically engaged. One could imagine other embodiments (not shown) wherein read enable element 130 receives a read-enable signal and write enable element 128 is automatically engaged upon being driven by the appropriate one or appropriate ones of bit lines 114–122, or wherein both function without the need for an enable signal. Since write enable element 128 and read enable element 130 are connected to one another, care must then be taken to avoid a logic conflict.

Figure 2:
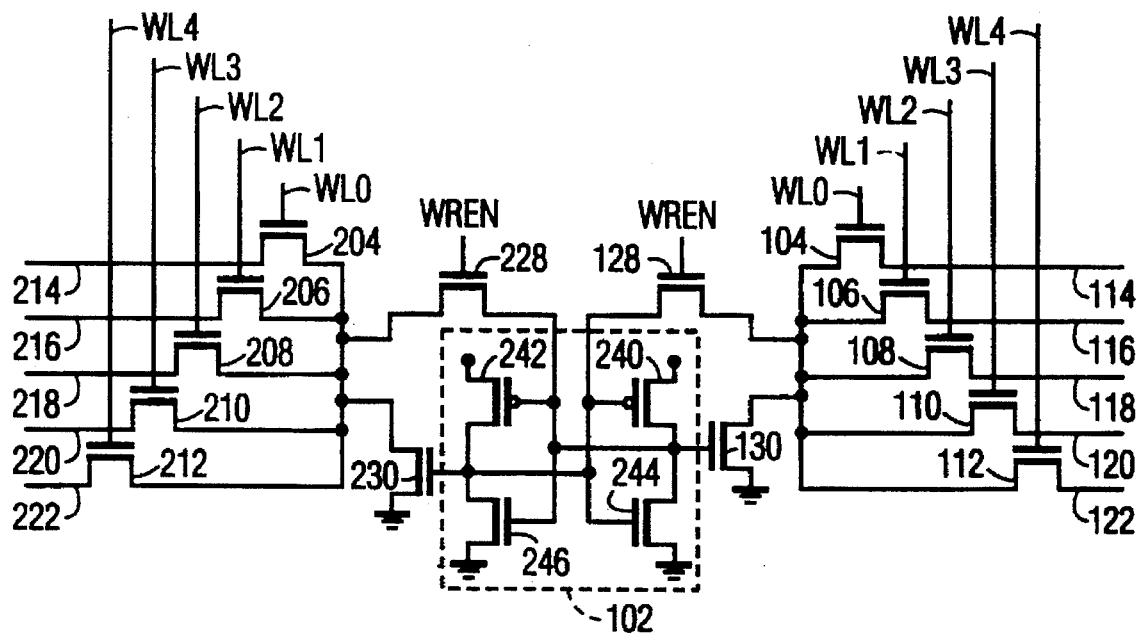
FIG. 2 is a transistor diagram of the preferred embodiment of the cell.

FIG. 2 is a transistor diagram of memory cell 100 in an SRAM embodiment. That is, storage element 102 comprises two cross-coupled inverters, each with a PFET 240, 242 and an NFET 244, 246 in series between VDD and GND. Owing to the symmetrical nature of SRAM storage element 102, there now are provided, in addition to switches 104–112 and bitlines 114–122, switches 204, 206, 208, 210 and 212, and complementary bitlines 214, 216, 218, 220 and 222. Switches 104–112 and 204–212 each include a respective NFET and are controlled pairwise through selection signals WL0–WL4. Also, in addition to write enable element 128 and read enable element 130, there are write enable element 228 and read enable element 230 arranged symmetrically. Write enable element 128 includes an NFET having a conduction channel connected between switches 104–112 on the one hand and an input of inverter 240/244 on the other hand, and receiving write enable signal WREN. Write enable element 228 includes an NFET having a conduction channel connected between switches 204–212 on the one hand and an input of inverter 242/246 on the other hand, and also receiving write enable signal WREN. Read enable element 130 comprises an NFET whose conduction channel is mounted between switches 104–112 and GND, and whose control electrode is connected to the output of inverter 240/244. Read enable element 230 comprises an NFET whose conduction channel is mounted between switches 204–212 and GND, and whose control electrode is connected to the output of inverter 242/246. Note that the precharging features (not shown) for precharging bit lines 114–122 (214–222) serve to cause a logic high at selected ones of bit lines 114–122 (214–222) when the output of inverter 240/244 (242/246) is a logic low.

Figure 3:
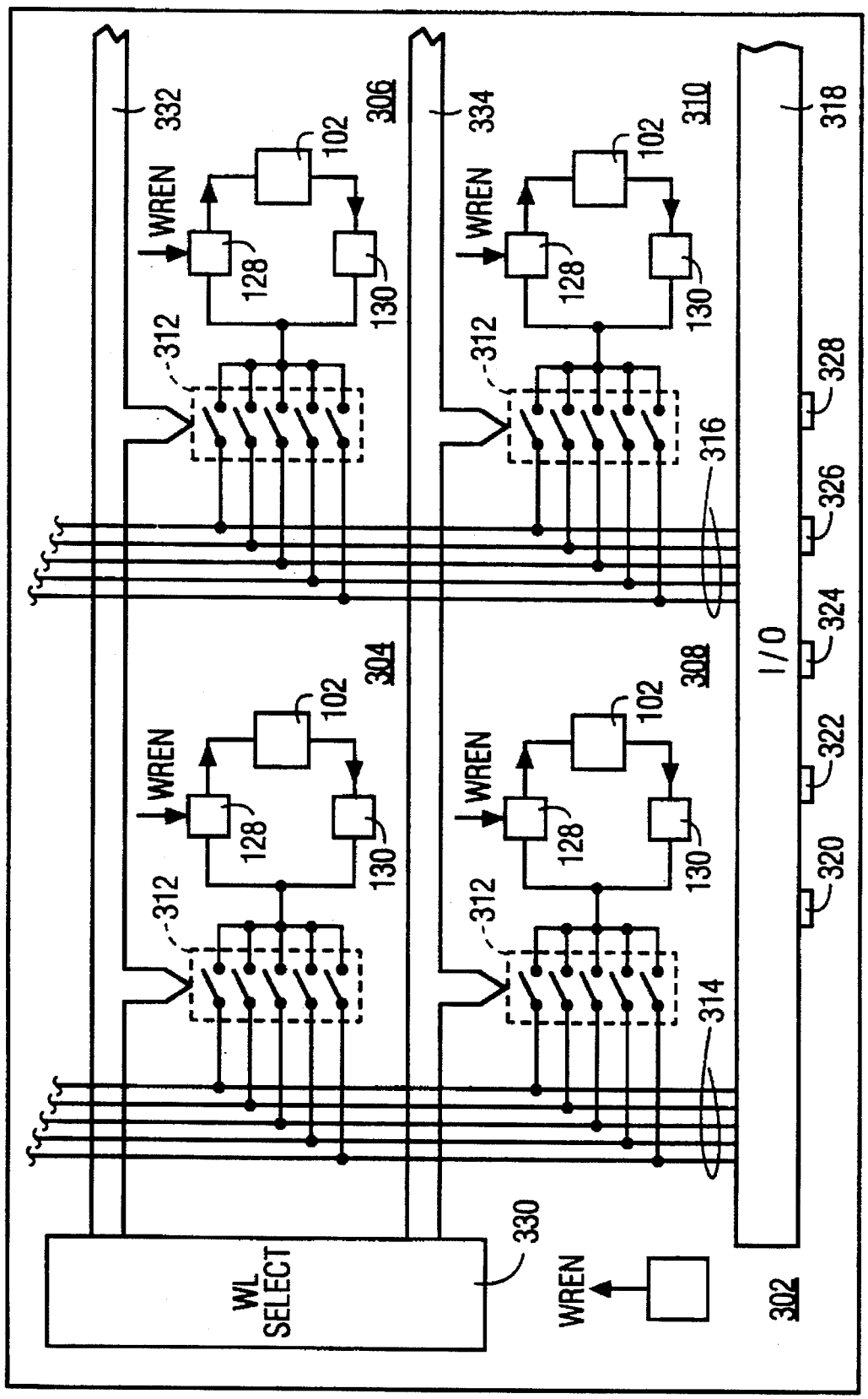
FIG. 3 is a block diagram of a circuit with a multiport memory according to the invention.

FIG. 3 is a block diagram of part of an electronic circuit 300 with a multi-port memory 302 that includes a plurality of memory cells 304, 306, 308 and 310 of the type shown in FIG. 1 or FIG. 2. Memory 302 is used, for example, as a register file in a data processor. In order not to obscure the drawing, switches 104–112 and 204–212 in FIGS. 1 and 2 are indicated collectively by reference numeral 312 in each of cells 304–310. Cells 304 and 308 are coupled to a group of bitlines 314. Cells 306 and 310 are coupled to a group of bit lines 316. Bit lines 314 and 316 are connected to a memory I/O circuit 318 that enables supply of data to or from selected ones of cells 304–310 via ports 320, 322, 324, 326 and 328. I/O circuit 318 permits providing data from, e.g., a single one of cells 304–310 to more than one of ports 320–328. Switches 312 in cells 304 and 306, and switches 312 in cells 308 and 310 receive control signals WL0–WL4 from word line selection circuit 330 via word lines 332 and 334. A write enable circuit 336 is operative to supply write enable signal WREN to write enable element 128 in each of cells 304–310.

I claim:

1. An electronic circuit with a multi-port memory that includes a plurality of memory cells, wherein:

each cell is coupled to multiple, independently controllable bitlines;

each cell comprises:

a storage device for storage of a single bit; and multiple switches, each respective one thereof being operative to selectively connect the storage device to a respective one of the bitlines; and each storage device comprises:

a write enable element coupled between the multiple switches and an input of the storage device for enabling writing of the cell; and a read enable element coupled between an output of the storage device and the multiple switches for enabling reading of the cell.

2. The circuit of claim 1, wherein at least the read enable element or the write enable element is rendered operative through a control signal.

3. The circuit of claim 2, wherein: the storage device comprises a pair of cross-coupled inverters; and the write enable element comprises a write enable transistor having a conduction channel coupled between the multiple switches and the input, and having a control electrode for receiving the control signal.

4. The circuit of claim 3, wherein:

the read enable element comprises a read enable transistor having a conduction channel coupled between the multiple switches and a reference voltage, and having a control electrode coupled to the output.

5. The circuit of claim 1, wherein the switches are operative to enable simultaneous reading of a specific one of the cells via at least two of the ports.

* * * * *